United States Patent [19]

Michael et al.

[11] 4,005,410

[45] Jan. 25, 1977

[54] ANALOGUE-TO-DIGITAL-CONVERTERS

[75] Inventors: Peter Colin Michael, Newbury; Paul Roderick Noel Kellar, Abingdon, both of England

[73] Assignee: Micro Consultants Limited, Surrey, England

[22] Filed: June 12, 1975

[21] Appl. No.: 586,445

[30] Foreign Application Priority Data

June 15, 1974 United Kingdom ............. 26613/74

[52] U.S. Cl. .................. 340/347 AD; 340/347 CC
[51] Int. Cl.² ....................................... H03K 13/02
[58] Field of Search ............. 340/347 AD, 347 CC

[56] References Cited

UNITED STATES PATENTS 2,730,676  1/1956  Barker ........................ 340/347 AD Primary Examiner—Charles D. Miller
Attorney, Agent, or Firm—Dowell & Dowell

[57] ABSTRACT

An analogue-to-digital converter comprising a plurality of stages in series, each stage including a full wave rectifier with two inputs and two outputs. Each of the inputs receives an analogue signal together with a constant current such that the full wave rectifier current reverses direction when the analogue signal reaches a predetermined level. Temperature compensation means are provided comprising voltage generators connected to the rectifier to provide a voltage bias thereto so as to enable the point of reversal of the rectifier current to remain constant over a wide range of ambient temperatures. The voltage generators have a temperature coefficient of voltage corresponding in magnitude and acting in the same sense as the bridge rectifier.

9 Claims, 4 Drawing Figures

ANALOGUE-TO-DIGITAL-CONVERTERS

BACKGROUND TO THE INVENTION

The invention is a development of the analogue-to-digital coverter described in British Pat. No. 1,266,962 and relates to the temperature compensation thereof.

The earlier arrangement disclosed in British Pat. No. 1,266,962 is shown in FIGS. 1 and 2 and comprises a plurality of stages of which two stages are shown and is suitable particularly when a large number of stages are employed for high resolution and when small analogue currents are to be converted to digital form, as the current level in each stage is similar due to the provision of differential "buffer" amplifiers between each stage. Each stage comprises a current amplifier 10, a full wave bridge rectifier 11 and a detector or comparator 12 and has provision for feeding a fixed offset current into the bridge, equal in magnitude to one half the peak-to-peak full scale output current range. These fixed offsets are provided by current generators 13, 14, 15 and 16.

The simplified circuit diagram of two stages is shown in FIG. 2. The amplifier 10 is formed as a balanced cascade differential amplifier from transistors TR1, 2, 3 and 4 with emitter load resistors R5 and R6 connected to a current source S1. The amplifier drives the bridge rectifier, formed by diodes D1, D2, D3, D4 directly and a bridge current offset is provided by unbalancing the inputs to the bases of TR1 and TR2 by suitable choice of resistors R1, R2, R3, R4. The stages each have two input terminals 20 and 21 and two output terminals 22 and 23 and operate with symmetrical, balanced input and output signal currents.

Current sources S2 and S3 form collector load circuits for the differential amplifier. Each of the sources S1, S2 and S3 are in the form of known precision constant current transistor circuits and are arranged such that, the sum of the currents S2 and S3 is equal to the current S1. The values of R5 and R6 are chosen so that the current flowing through each of transistors TR1, TR2, TR3, TR4, when the bridge is balanced, is substantially larger e.g. at least five times than the maximum change of current through those transistors when the input current changes from maximum to zero.

All stages of the converter employ identical circuits but the polarity of the transistors and diodes is reversed in alternate stages as shown to facilitate direct interconnection.

The detectors 12 are arranged so as to detect the point of reversal of the bridge output current, and provide a logical and output when the current is flowing in one arm of the bridge, and a logical zero when it flows in the opposite arm. The current detector or comparator 12 may comprise e.g. a differential switch or Schmitt trigger circuit.

Although FIGS. 1 and 2 show a two-stage Analogue to Digital converter and a single stage converter respectively, further stages may be added to improve the resolution. When a suitably scaled input signal is applied to the first stage of either arrangement, the logical outputs from the detectors provide a digital version of the input in a code known as Gray or Reflected Binary.

As the balanced analogue input to the differential amplifier of the analogue-to-digital converter is increased linearly from minus full scale, through zero to plus full scale, the full wave rectifier causes the output current to vary from minus full scale through zero to plus full scale and back through zero to minus full scale. A relatively large voltage swing occurs in the differential amplifier to achieve a current reversal in the rectifier and this can cause a speed limitation.

When using semiconductor diodes for the bridge rectifier, as the ambient temperature falls the characteristic forward voltage drop across the semiconductor diode increases. Conversely when the ambient temperature rises the voltage drop decreases. This variation of the voltage drop of the diode with temperature causes variation in the forward bias in the above circuit and there will be corresponding variations in voltage swing at the collectors of the transistors of the differential amplifier so that the points at which a current reversal is achieved in the circuit will be dependent on the ambient temperature.

Thus this known converter will only operate satisfactorily over the temperature range 0° to +50° C.

OBJECT OF THE INVENTION

The object of the present invention is to provide an analogue-to-digital converter which can operate over a wide temperature range. The technique according to the invention allows the converter to operate without significant loss of band width over the temperature range −70° C to +125° C.

SUMMARY OF THE INVENTION

According to the invention there is provided in an analogue-to-digital converter comprising a plurality of stages in series, each stage including a full wave rectifier with two inputs and two outputs, each of said inputs receiving an analogue signal together with a constant current such that the full wave rectifier current reverses direction when said analogue signal reaches a predetermined level, the provision of temperature compensation means comprising voltage generators connected to said rectifier to provide a voltage bias thereto so as to enable the point of reversal of the rectifier current to remain constant over a wide range of ambient temperatures, said voltage generators have a temperature coefficient of voltage corresponding in magnitude and acting in the same sense as the bridge rectifier.

BRIEF DESCRIPTION OF THE DRAWINGS

The invention will now be described, by way of example, with reference to the accompanying drawings, in which.

DESCRIPTION OF PREFERRED EMBODIMENT

Figure 1:
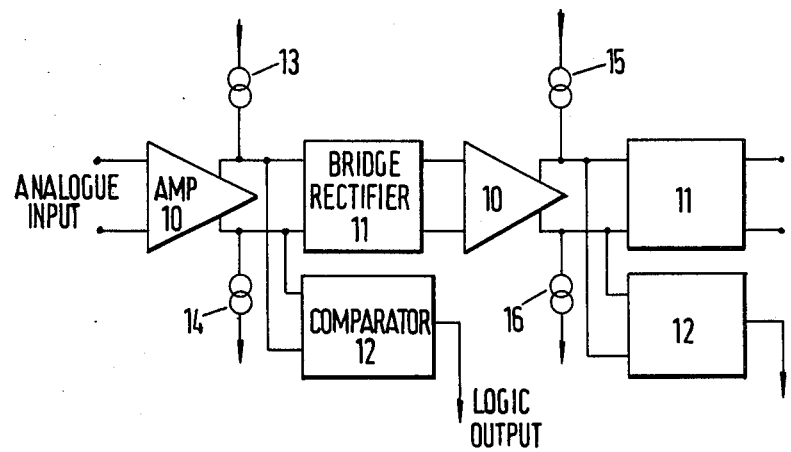
FIG. 1 shows a block diagram of the converter disclosed in British Pat. No. 1,266,962.
Figure 2:
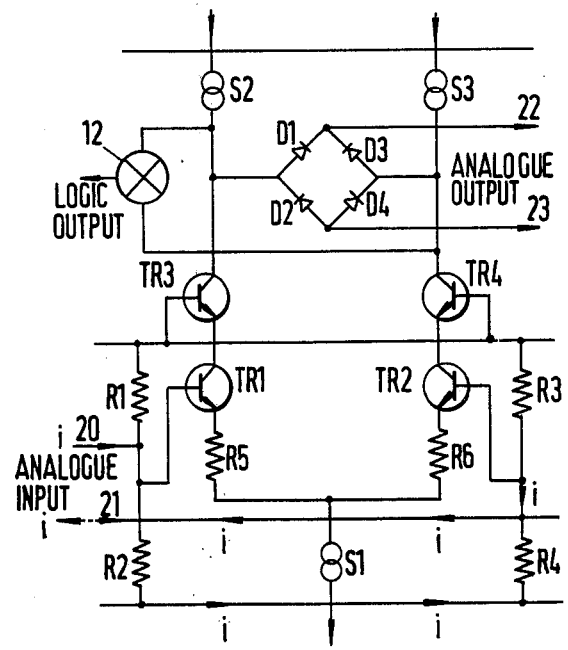
FIG. 2 shows a circuit diagram of one stage of the converter of FIG. 1.
Figure 3:
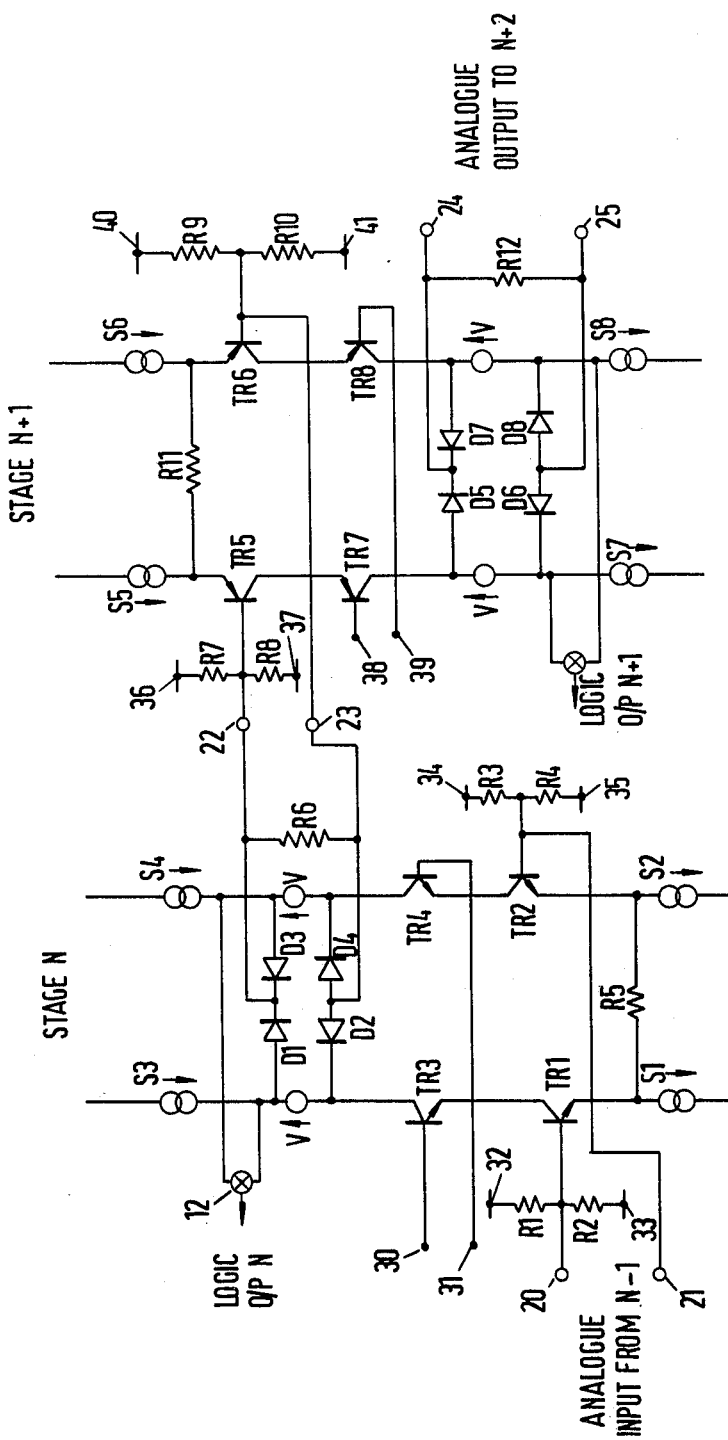
FIG. 3 shows a circuit diagram of two successive stages of the analogue-to-digital converter of the present invention.

The circuit of FIG. 3 shows a configuration similar to that described in our British Pat. No. 1,266,962 referred to above. In addition, however, a voltage generator V is provided connected between the anode of D1 and the cathode of D2 and a further generator V is provided between the anode of D3 and the cathode of D4, of stage N. In the N+1 stage, voltage generators are again provided one connected between the anode of D5 and the cathode of D6, and the other connected between the anode of D7 and the cathode of D8.

Points 30–41 are connected to constant voltage bias lines.

The analogue input from stage N−1 is applied to inputs 20 and 21 of stage N and the output from this stage to inputs 22 and 23 of stage N+1. The output from this stage is taken from outputs 24 and 25. R6, R7, R8, R9, R10 and V are chosen so that when the bridge D1, D2, D3 and D4 is balanced, i.e. when the large voltage swing at the collectors of TR3 and TR4 occurs, the correct minimum forward bias voltage exists across D1, D2, D3 and D4. The voltage generators V are chosen so that their temperature coefficient of voltage is similar in magnitude to and in the same sense as that of two of the diodes D1–D4 together, thus giving a constant forward bias to the bridge of the changeover point and hence a constant voltage swing and stage bandwidth.

Thus the effective forward bias on the diodes in the full wave rectifier of any stage is maintained constant as the ambient temperature varies over a wide range by increasing the applied forward bias to the diodes as the temperature falls to match the variation with temperature so that the required voltage swing at the critical points is not increased. In a similar manner, the applied forward bias is reduced as the ambient temperature rises.

Practical devices for each of the voltage generators V are either two diodes of the same type as D1–D4, or if hot carrier silicon-metal junction diodes are used for D1–D4, a single silicon PN junction diode or a saturated transistor may be used as an alternative to two hot carrier diodes (Schottky diodes) in series.

If single silicon diodes are used as the voltage generators, these are connected with anodes to the anodes of D1, D3, D5 and D7 and cathodes to cathodes of D2, D4, D6 and D8 respectively. If each generator comprises two Schottky diodes, these are connected as above but with two diodes in series.

If a silicon transistor is used this will have its emitter to the cathodes of D2, D4, D6 and D8 and its collector strapped to the base and connected to the anodes of D1, D3, D5 and D7 respectively.

Since the differential voltage to the amplifier TR5, TR6 and R11 is offset by the network R6, R7, R8, R9 and R10, it is necessary to use two offset current generators S5 and S6 for stage N+1. These are also precision current generators and as before S5 + S6 = S7 + S8.

Figure 4:
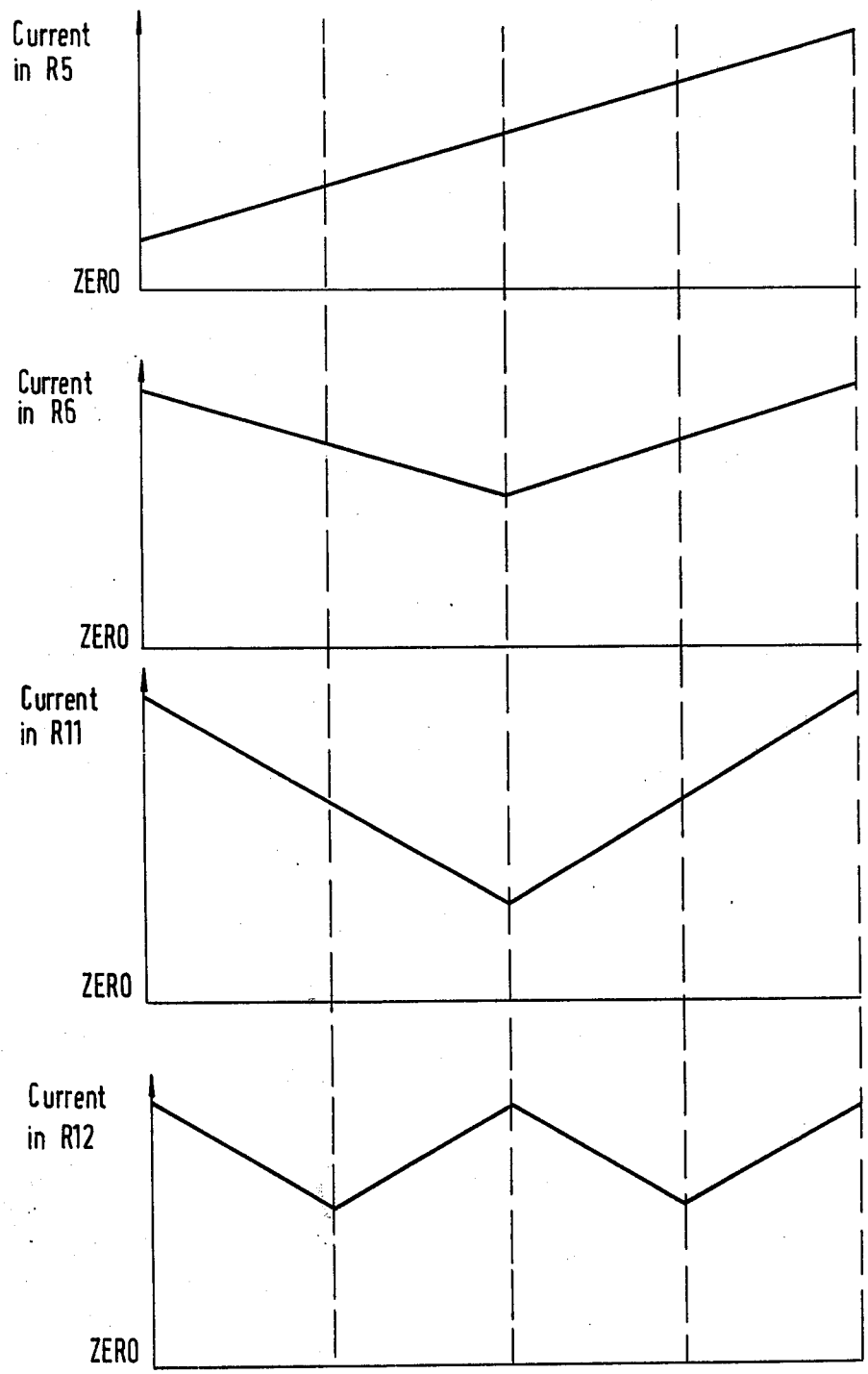
FIG. 4 shows the current swings in resistors R5, R6, R11 and R12 of FIG. 3 as the differential input to state N increases linearly from negative full scale to positive full scale.

This offset means that the current in R5 and R11 may not change in direction over the input range of the converter (see FIG. 4). Similarly, although the current in R6 and R12 due to the diodes D1–D4 and D5–D8 does fall to zero and change direction, the total current in R6 and R12 is unipolar.

It should be noted that the first stage of such a converter does not necessarily have such an offset in the current generators S1 and S2, so that the input voltage swing to the first differential amplifier may be symmetrical.

A logic detector 12 is provided at each stage which gives a logic one when the analogue current input for that stage is above the predetermined level and a logic zero when the analogue current input is below the predetermined level. Alternatively, a differential switch or a low-gain linear amplifier of the line receiver type may be used as the detector.

We claim:

1. In an analogue-to-digital converter including a plurality of stages in series, each stage including a full wave rectifier having rectifier arms and having two inputs and two outputs, each of said inputs receiving an analogue signal together with a constant current such that the full wave rectifier current reverses direction when said analogue signal reaches a predetermined level as determined by said input constant current, the provision of temperature compensation means comprising voltage generators connected in series between the arms of said full wave rectifier to provide a voltage bias thereto of such magnitude and polarity that said level of reversal of the rectifier current will remain constant over a wide range of ambient temperatures, said voltage generators having a temperature coefficient of voltage corresponding in magnitude and acting in the same sense as the bridge rectifier arms to which they are connected, thereby to provide a stage bandwidth substantially constant with temperature.

2. An analogue-to-digital converter according to claim 1, wherein the voltage generators are biased diodes.

3. An analogue-to-digital converter according to claim 2, wherein the diodes are hot carrier silicon-metal junction diodes.

4. An analogue-to-digital converter according to claim 2, wherein the diodes are silicon PN junction diodes.

5. An analogue-to-digital converter according to claim 1, wherein the voltage generators are saturated transistors.

6. An analogue-to-digital converter according to claim 1, wherein the constant current applied to each stage is of a magnitude which is half the predetermined full scale current for each stage after allowing for the bias from the voltage generators.

7. An analogue-to-digital converter according to claim 1, wherein a logic detector is provided in each stage so as to give a logic one when the analogue current input for that stage is above the predetermined level and a logic zero when the analogue current input is below the predetermined level.

8. An analogue-to-digital converter according to claim 7, wherein a differential switch or a low-gain amplifier of the line receiver type is used as the detector.

9. An analogue-to-digital converter according to claim 1, wherein a differential amplifier is connected between each stage, so that the output current of each stage varies linearly between a maximum and minimum and back to a maximum as the stage input varies linearly from maximum to minimum.

* * * * *